United States Patent
Komori et al.

(10) Patent No.: US 7,227,780 B2
(45) Date of Patent: Jun. 5, 2007

(54) SEMICONDUCTOR DEVICE AND CONTROL METHOD THEREOF

(75) Inventors: Hideki Komori, Fujisawa (JP); Shouichi Kawamura, Kodaira (JP); Masanori Taya, Ashibetsu (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/289,997

(22) Filed: Nov. 30, 2005

(65) Prior Publication Data

US 2006/0245250 A1    Nov. 2, 2006

Related U.S. Application Data

(63) Continuation of application No. PCT/JP2004/017806, filed on Nov. 30, 2004.

(51) Int. Cl.
G11C 11/34    (2006.01)
(52) U.S. Cl. .................. 365/185.14; 365/185.19; 365/189.06; 365/189.09; 365/233
(58) Field of Classification Search .......... 365/185.14, 365/185.19, 189.06, 189.09, 233
See application file for complete search history.

(56) References Cited

U.S. PATENT DOCUMENTS 4,685,085 A *  8/1987  Spence .................. 365/185.08

2003/0038670 A1 *  2/2003  Li ........................... 327/536
2004/0012997 A1    1/2004  Mihara ................... 365/185.2

FOREIGN PATENT DOCUMENTS

| JP | 6-96593 | 4/1994 |
|----|---------|--------|
| JP | 2001015716 | 1/2001 |
| JP | 2003-199329 | 7/2003 |
| JP | 2004-55012 | 2/2004 |
| JP | 2004-334994 | 11/2004 |

* cited by examiner

Primary Examiner—Tuan T. Nguyen

(57) ABSTRACT

A semiconductor device including a program voltage supply circuit that supplies a drain of a memory cell with a program voltage, a detection circuit that refers to an output voltage of the program voltage supply circuit and detects a decrease of the program voltage supplied thereby, a frequency converting circuit that generates the clock signal by converting a frequency of a clock signal generated by an oscillator circuit into a lower frequency when the program voltage supplied by the program voltage supply circuit becomes equal to or lower than a given voltage, and a voltage generating circuit that generates a voltage supplied to a gate of the memory cell by using a clock signal, the frequency of which is converted by the frequency converting circuit. It is therefore possible to make the best use of the ability of the program voltage generating circuit in programming.

14 Claims, 11 Drawing Sheets

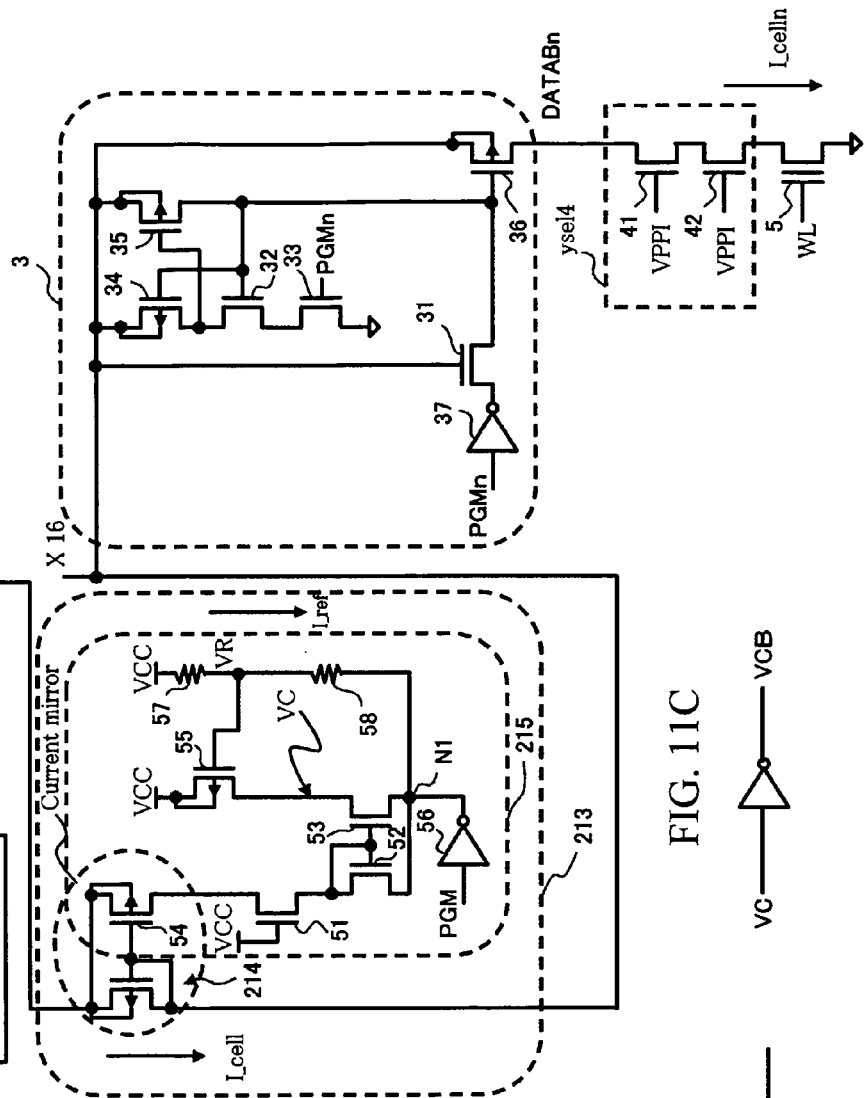
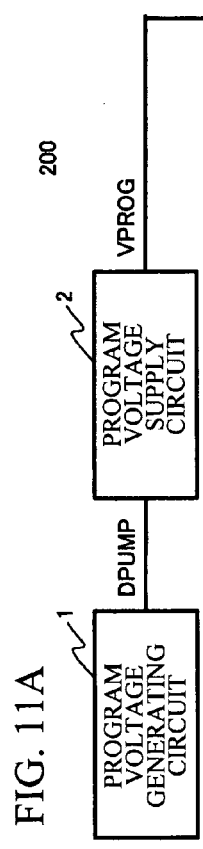
FIG. 11A
FIG. 11B
FIG. 11C

SEMICONDUCTOR DEVICE AND CONTROL METHOD THEREOF

CROSS REFERENCE TO RELATED APPLICATIONS

This is a continuation of International Application No. PCT/JP2004/017806, filed Nov. 30, 2004.

BACKGROUND OF THE INVENTION

1. Field of the Invention

This invention relates to a semiconductor device and a control method thereof.

2. Description of the Related Art

FIG. 1 is a view showing a circuit configuration of a conventional non-volatile semiconductor memory device at the time of programming. As shown in FIG. 1, a non-volatile semiconductor memory device 20 includes a program voltage generating circuit 1, a program voltage supply circuit 2, a data in buffer circuit (dinbuf_be) 3, a Y decoder (ysel) 4, and a memory cell 5. The memory cell 5 is a flash memory having a floating gate or a nitride film, serving as a charge accumulation layer. A high voltage is applied to a drain terminal of the memory cell 5 to inject hot carriers into the charge accumulation layer at the time of programming. A high program voltage VPROG in the non-volatile semiconductor memory device 20 is a voltage in which the voltage generated by the program voltage generating circuit 1 is regulated to a constant voltage, and is supplied to a common data bus line connected to a bit line BL via the program voltage supply circuit 2.

The semiconductor memory device described in Japanese Patent Application Publication No. 2001-15716 (hereinafter referred to as Document 1) controls a current supplied to the drain of the memory cell with a constant current element that controls the current not to exceed a given value, when a hot electron is injected into the floating gate, and is capable of suppressing a program period at minimum by controlling the gate voltage to be supplied to the control gate output from a given comparator.

However, the program voltage generating circuit (drain pump) 1 that supplies the current to the drain of the memory cell 5 needs a current supply capacity equal to or greater than (the number of bits to be programmed)×(a program current for every bit). When multiple bits are programmed simultaneously, a large amount of current flows through the memory cell 5 at the time of programming. There arises the problem in that the output voltage of the drain pump is decreased and the multiple bits cannot be programmed simultaneously. In addition, the current supply capacity can be enhanced by increasing the number of the program voltage generating circuits 1, yet this causes another problem of enlarging the circuitry scale. Further, there is further another problem in that the technique described in Document 1 cannot control the gate voltage correctly.

SUMMARY OF THE INVENTION

The present invention has been made in view of the above-mentioned circumstances and provides a semiconductor device and the control method thereof, in which multiple bits can be programmed simultaneously without enlarging a circuitry scale.

According to an aspect of the present invention, preferably, there is provided a semiconductor device including a program voltage supply circuit that supplies a drain of a memory cell with a program voltage, and a voltage generating circuit that generates a voltage supplied to a gate of the memory cell by using a clock signal based on the program voltage supplied by the program voltage supply circuit. According to the present invention, the gate voltage can be controlled and multiple bits can be programmed simultaneously so as not to exceed the current supply capacity of the program voltage generating circuit, by using the clock signal determined on the basis of the program voltage supplied by the program voltage supply circuit. It is therefore possible to make the best use of the ability of the program voltage generating circuit at the time of programming. Furthermore, the number of the program voltage generating circuits does not have to be increased and the circuitry scale is not enlarged.

On the above-mentioned semiconductor device, preferably, the voltage generating circuit uses, a clock signal having a lower and a higher frequency, and wherein the lower frequency is used when the program voltage supplied by the program voltage supply circuit becomes equal to or lower than a given voltage. According to the present invention, if the program voltage is lowered than a given voltage, charge pumping of the gate voltage can be delayed and the multiple bits can be programmed simultaneously so as not to exceed the current supply capacity of the program voltage generating circuit.

The semiconductor device may further include a frequency converting circuit that generates the clock signal by converting a frequency of a clock signal generated by an oscillator circuit into another frequency based on the program voltage supplied by the program voltage supply circuit. According to the present invention, the gate voltage can be controlled so as not to exceed the current supply capacity of the program voltage generating circuit.

The semiconductor device may further include a frequency converting circuit that generates the clock signal by converting a frequency of a clock signal generated by an oscillator circuit into a lower frequency when the program voltage supplied by the program voltage supply circuit becomes equal to or lower than a given voltage. According to the present invention, the charge pumping of the gate voltage can be delayed according to the drop in the program voltage.

The semiconductor device may further include a detection circuit that refers to an output voltage of the program voltage supply circuit and detects a decrease of the program voltage supplied thereby. According to the present invention, monitoring the output current of the program voltage supply circuit can detect whether the output current exceeds the current supply capacity of the program voltage generating circuit.

The semiconductor device may further include a detection circuit that refers to an output current of the program voltage supply circuit and detects a decrease of the program voltage supplied thereby. According to the present invention, monitoring the output current of the program voltage supply circuit can detect whether the output current exceeds the current supply capacity of the program voltage generating circuit.

The semiconductor device may further include a circuit that generates a control signal for controlling the frequency of the clock signal converted by the frequency converting circuit in accordance with the program voltage supplied by the program voltage supply circuit.

On the above-mentioned semiconductor device, preferably, the voltage generating circuit generates the voltage supplied to the gate of the memory cell by a ramping manner. The voltage generating circuit may include, for example, a diode type charge pump. The semiconductor device may be a semiconductor memory device.

According to another aspect of the present invention, preferably, there is provided a method of controlling a semiconductor device including the steps of supplying a program voltage to a drain of a memory cell, and generating a voltage supplied to a gate of the memory cell by using a clock signal determined based on the program voltage. According to the present invention, the gate voltage can be controlled and multiple bits can be programmed simultaneously so as not to exceed the current supply capacity of the program voltage generating circuit, by using the clock signal determined on the basis of the program voltage supplied by the program voltage supply circuit. It is therefore possible to make the best use of the ability of the program voltage generating circuit at the time of programming. Furthermore, the number of the program voltage generating circuits does not have to be increased and the circuitry scale is not enlarged.

The above-mentioned method may further include a step of converting a frequency of a clock signal generated by an oscillator circuit into a lower frequency when the program voltage becomes equal to or lower than a given voltage, wherein the step of generating generates the voltage supplied to the gate of the memory cell by using the clock signal of the lower frequency. According to the present invention, the charge pumping can be delayed according to the drop in the program voltage.

The above-mentioned method may further include a step of detecting the program voltage by referring to an output voltage of a program voltage supply circuit that generates the program voltage. According to the present invention, monitoring the output current of the program voltage supply circuit can detect whether the output current exceeds the current supply capacity of the program voltage generating circuit.

The above-mentioned method may further include a step of detecting the program voltage by referring to an output current of a program voltage supply circuit that generates the program voltage. According to the present invention, monitoring the output current of the program voltage supply circuit can detect whether the output current exceeds the current supply capacity of the program voltage generating circuit.

The present invention is capable of providing a semiconductor device and a control method thereof, in which multiple bits can be programmed simultaneously without enlarging a circuitry scale.

BRIEF DESCRIPTION OF THE DRAWINGS

FIGS. 11A through 11C are views partially showing the circuit configuration of a non-volatile semiconductor memory device in accordance with a second embodiment of the present invention;

DESCRIPTION OF THE PREFERRED EMBODIMENTS

A description will now be given, with reference to the accompanying drawings, of embodiments of the present invention.

First Embodiment

Figure 1:
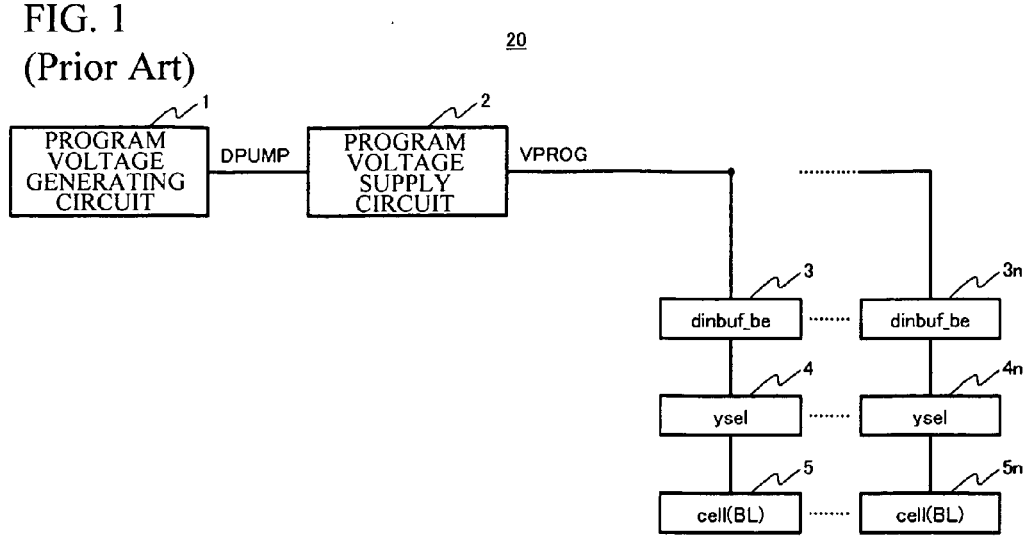
FIG. 1 is a view showing a circuit configuration of a conventional non-volatile semiconductor memory device at the time of programming.
Figure 2:
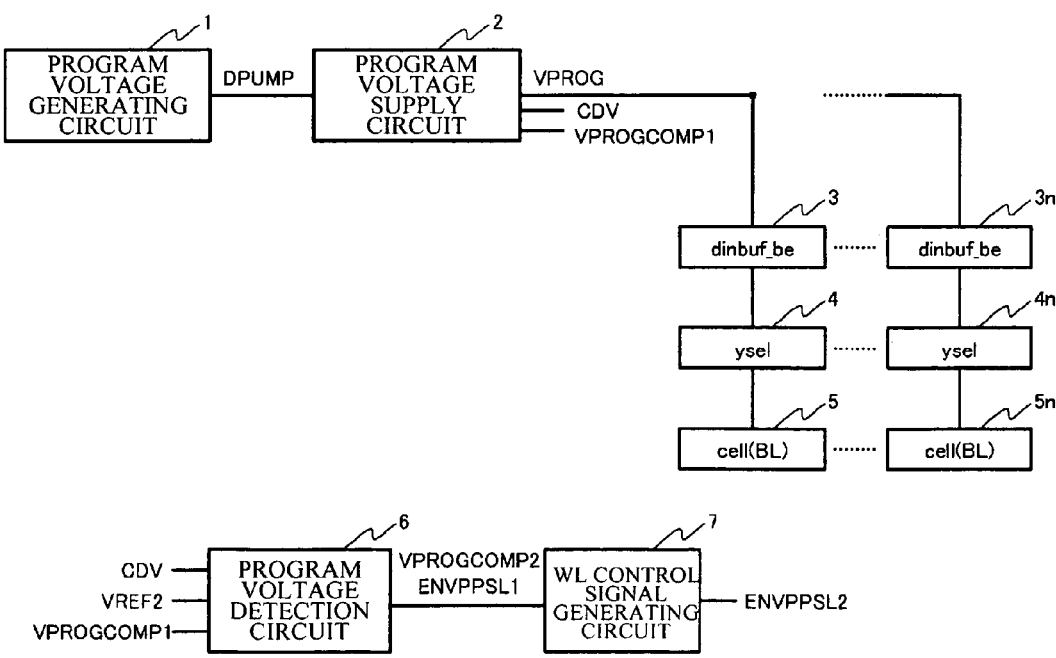
FIG. 2 is a view partially showing a circuit configuration of the non-volatile semiconductor memory device in accordance with a first embodiment of the present invention.
Figure 3:
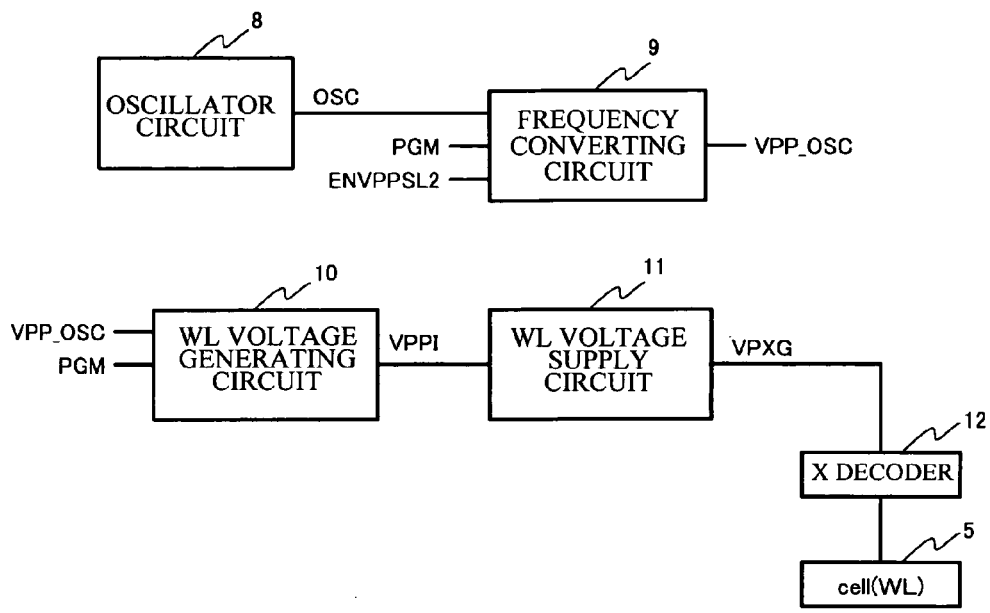
FIG. 3 is another view partially showing the circuit configuration of the non-volatile semiconductor memory device in accordance with the first embodiment of the present invention.

FIG. 2 is a view partially showing a circuit configuration of the non-volatile semiconductor memory device in accordance with the first embodiment of the present invention. As shown in FIG. 2 and FIG. 3, the non-volatile semiconductor memory device 10 includes a program voltage generating circuit 1, a program voltage supply circuit 2, a data in buffer circuit 3, a Y decoder (ysel) 4, a memory cell 5, a program voltage detection circuit 6, a WL voltage control signal generating circuit 7, an oscillator circuit 8, a frequency converting circuit 9, a WL voltage generating circuit 10, a WL voltage supply circuit 11, and an X decoder 12.

In the memory cell 5, for example, there are provided an N-type source region and a drain region on a surface of a p-type substrate, and there are also provided a floating gate and control gate on a channel region between the above-mentioned regions. The control gate is connected to the word line WL, the drain region is connected to the bit line, and the source region is connected to a source line.

In a program operation, the bit line and the word line are configured to have high potentials and the source line is configured to have a low potential such as ground, in the memory cell having data of "1" (erase state) in which no charge is injected in the floating gate thereof. Then, a high voltage is applied between the source and drain to generate a hot electron. The hot electron is injected into the floating gate.

The program voltage generating circuit 1 is composed, for example, of a diode type charge pump, and generates a pumping voltage DPUMP to supply the program voltage VPROG to the bit line BL. The program voltage supply circuit 2 supplies the drain of the memory cell 5 with the program voltage VPROG. The program voltage supply circuit 2 adjusts the pumping voltage DPUMP generated by the program voltage generating circuit 1, and supplies the program voltage VPROG to the data bus connected to the bit line BL. Also, the program voltage supply circuit 2 generates an internal reference voltage CD and a signal VPROG-COMP1.

The program voltage detection circuit 6 detects a drop in the program voltage VPROG supplied by the program voltage supply circuit 2, judging from an output voltage of the program voltage supply circuit 2. Specifically, the program voltage detection circuit 6 detects the level of program voltage VPROG, based on an internal reference voltage CDV of the program voltage supply circuit 2 and a second reference voltage VREF 2. Here, the current flowing through the memory cell 5 at the time of programming is determined by the level of the electron injection into the memory cell 5 and the drain voltage and the gate voltage of the memory cell 5. If the current flowing through the memory cell 5 is increased too much in programming the multiple bits simultaneously and exceeds the current supply capacity of the program voltage generating circuit 1, the program voltage VPROG is lowered and in some cases, the memory cell 5 cannot be programmed. For this reason, in accordance with the present embodiment, by controlling the gate voltage so as not to exceed the current supply capacity of the program voltage generating circuit 1 according to the program voltage VPROG, multiple bits can be programmed simultaneously making the best possible use of the current supply capacity of the program voltage generating circuit 1.

The WL voltage control signal generating circuit 7 generates a control signal ENVPPSL2 for controlling the frequency of a clock signal VPP_OSC converted in the frequency converting circuit 9, according to the output voltage of the program voltage supply circuit 2 detected by the program voltage detection circuit 6.

The oscillator circuit 8 generates a clock signal OSC by oscillate operation. The frequency converting circuit 9 receives the control signal ENVPPSL2 and a signal PGM that turns to High at the time of programming, and converts the clock signal OSC into the clock signal VPP_OSC. For example, if there is a voltage drop from a constant value in an output from the program voltage supply circuit 2 supplying the drain voltage, the frequency converting circuit 9 slows the frequency of the clock signal OSC applied from the oscillator circuit 8 and converts into the clock signal VPP_OSC having the frequency lower than that of the clock signal OSC so as to generate the clock signal to be determined based on the program voltage. In contrast, if there is no voltage drop from a constant value in an output from the program voltage supply circuit 2 supplying the drain voltage, the frequency converting circuit 9 outputs the clock signal VPP_OSC having the frequency equal to that of the clock signal OSC applied from the oscillator circuit 8. In this manner, the frequency converting circuit 9 converts the frequency of the clock signal OSC according to the program voltage VPROG supplied from the program voltage supply circuit 2. This makes it possible to delay the charge pumping of the gate voltage according to the drop of the program voltage.

The WL voltage generating circuit 10 generates the voltage supplied to the gate of the memory cell 5 by a ramping manner with the use of the clock signal VPP_OSC to be determined on the basis of the program voltage VPROG supplied from the program voltage supply circuit 2. Here, the ramping manner is a method of applying the voltage to the gate of the cell while increasing the voltage so as to program the cell properly. The WL voltage generating circuit 10 is composed, for example, of the diode type charge pump, and receives the clock signal VPP_OSC and the signal PGM output from the frequency converting circuit 9 and then generates a charge pumped voltage VPPI of a high voltage of the word line WL.

Figure 4:
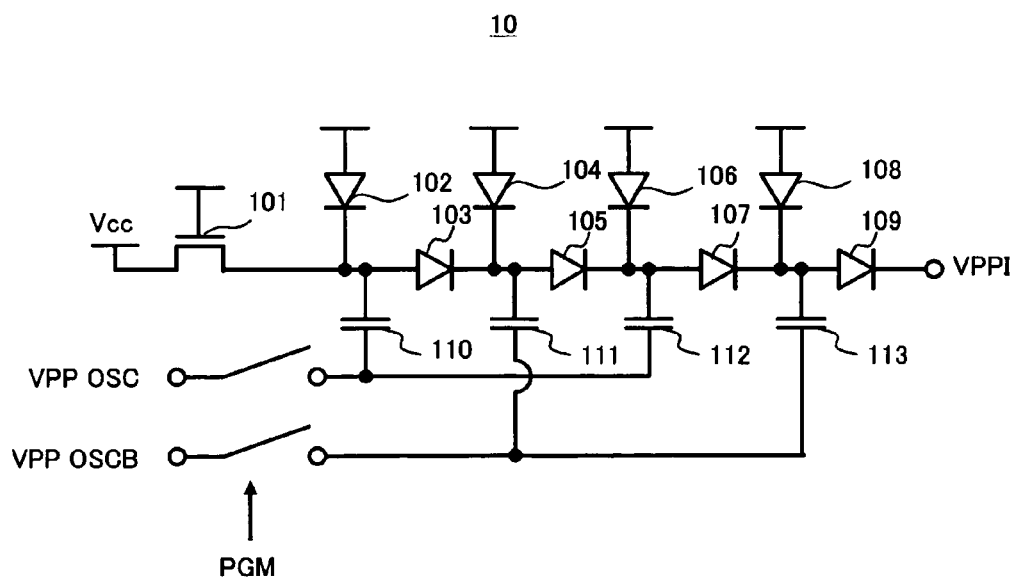
FIG. 4 is a view showing a WL voltage generating circuit in accordance with the first embodiment of the present invention.

FIG. 4 is a view showing the WL voltage generating circuit in accordance with the first embodiment. As shown in FIG. 4, the WL voltage generating circuit 10 includes a transistor 101, diodes 102 through 109, and capacitors 110 through 113. The WL voltage generating circuit 10 is a charge pump circuit in which the multiple capacitors 110 through 113 connected in parallel by the diodes 102 through 109. When the signal PGM turns to High, the capacitors 110 through 113 are driven by the clock signal VPP_OSC and a complementary signal thereof VPP_OSCB and accordingly the charge pumped VPPI is output.

The WL voltage generating circuit 10 determines a pumping rate of the word line WL to be pumped according to the clock signal VPP_OSC output from the frequency converting circuit 9. For example, if the program voltage VPROG supplied from the program voltage supply circuit 2 is dropped to a voltage value equal to or lower than a given voltage value, the WL voltage generating circuit 10 employs the second clock signal VPP_OSC having the frequency lower than that of the first clock signal OSC as the clock signal to be determined on the basis of the program voltage and generates the voltage to be supplied to the gate of the memory cell 5. Here, the pumping rate becomes lower as the clock becomes slow.

The WL voltage supply circuit 11 operates to adjust the charge pumped voltage VPPI generated by the WL voltage generating circuit 10 to a given voltage, and applies a gate voltage VPXG to the X decoder 12.

Figure 5:
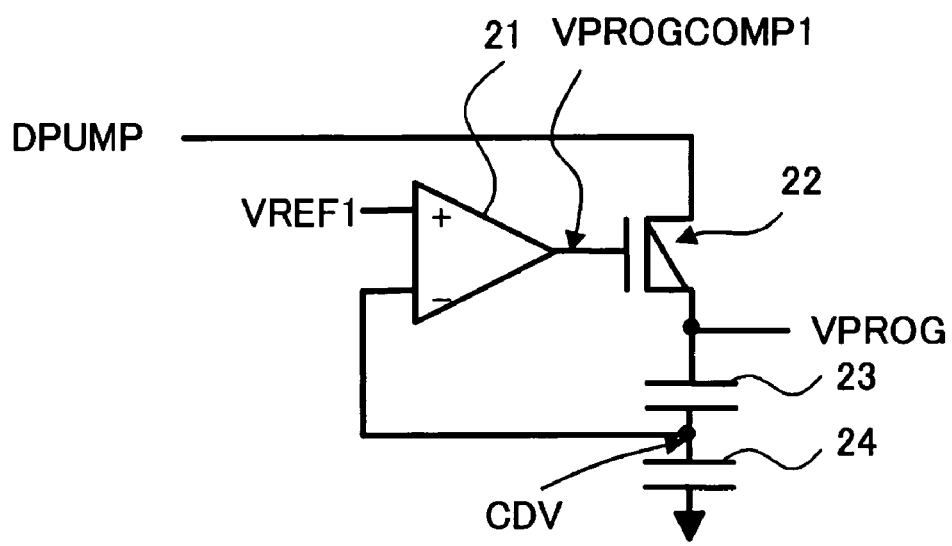
FIG. 5 a view showing a program voltage supply circuit in accordance with the first embodiment of the present invention.

FIG. 5 is a view showing the program voltage supply circuit 2. As shown in FIG. 5, the program voltage supply circuit 2 includes a comparator circuit 21, a PMOS transistor 22, and capacitors 23 and 24. The program operation starts, and the pumping voltage DPUMP and the program voltage VPROG are pumped, then a divided voltage CDV of the program voltage VPROG becomes higher than a reference voltage VREF1. The comparator circuit 21 outputs a signal VPROGCOMP1 of high to squeeze and regulate the gate of the PMOS transistor 22 so that the program voltage VPROG may not be increased much higher. The divided voltage CDV of the program voltage VPROG is supplied to the program voltage detection circuit 6 as an internal reference voltage of the program voltage supply circuit 2, and the signal VPROGCOMP1 output from the comparator circuit 21 is supplied to the program voltage detection circuit 6.

Figure 6:
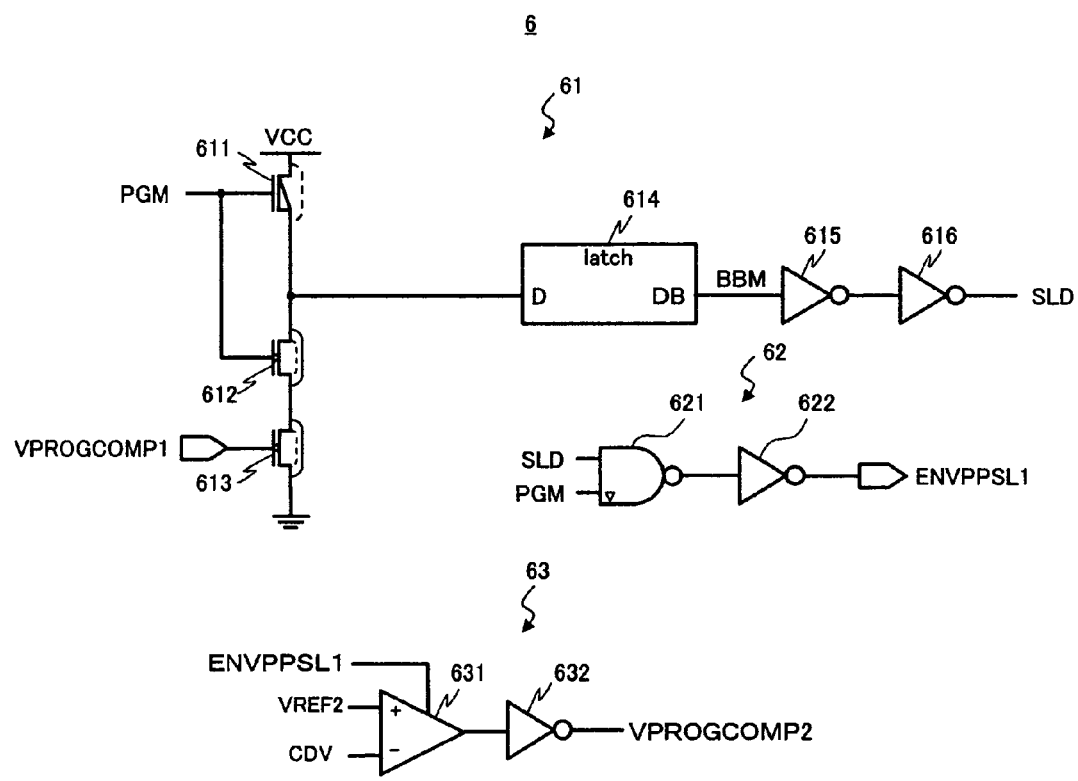
FIG. 6 a view showing a program voltage detection circuit in accordance with the first embodiment of the present invention.

FIG. 6 is a view showing the program voltage detection circuit 6. As shown in FIG. 6, the program voltage detection circuit 6 includes circuits 61 through 63. The circuit 61 includes a PMOS transistor 611, NMOS transistors 612 and 613, a latch circuit 614, inverters 615 and 616. The program voltage detection circuit 6 generates a signal SLD with the signal PGM that tunes to high at the time of programming and the signal VPROGCOMP1 output from the comparator circuit 21 in the program voltage supply circuit 2.

A circuit 62 includes a NAND circuit 621 and an inverter 622 to generate a signal ENVPPSL1 with the signal SLD and the signal PGM. A circuit 63 includes a comparator circuit 631 and an inverter 632. Here, it is configured that the reference voltage VREF2 is smaller than the reference voltage VREF1. When the signal ENVPPSL1 is low, the comparator circuit 631 is inactive and a signal VPROG-COMP2 output from the inverter 632 is low. In contrast, when the signal ENVPPSL1 is high, namely, the program voltage VPROG is increased at the time of program start and the divided voltage CDV exceeds the reference voltage VREF1, the latches circuit 614 latches a signal of high (on an output DB) and the comparator circuit 631 is activated. Then, the program voltage VPROG is dropped and the divided voltage CDV gets lower than the reference voltage VREF2, the signal VPROGCOMP2 turns to high.

Figure 7:
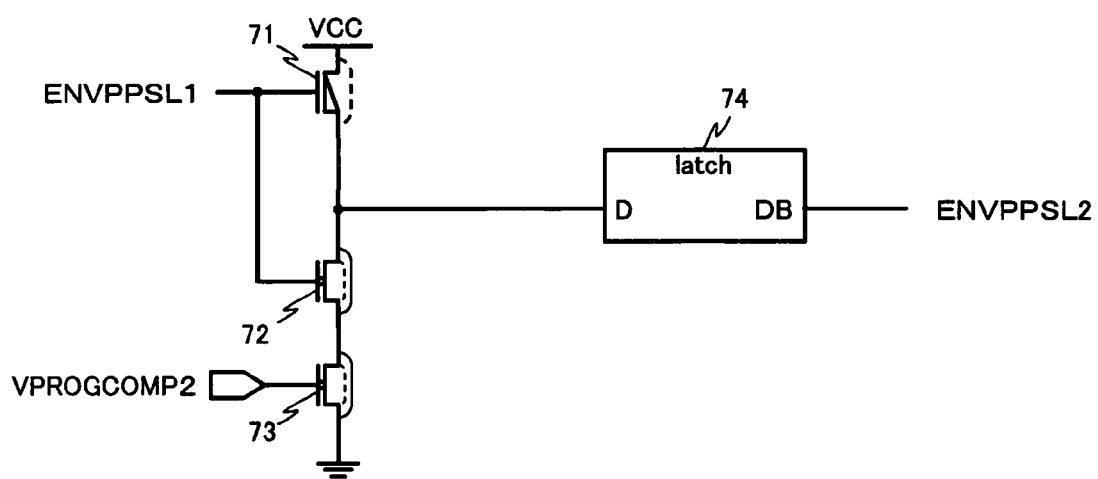
FIG. 7 a view showing a WL voltage control signal generating circuit in accordance with the first embodiment of the present invention.

FIG. 7 is a view showing the WL voltage control signal generating circuit 7. As shown in FIG. 7, the WL voltage control signal generating circuit 7 includes a PMOS transistor 71, NMOS transistors 72 and 73, and a latch circuit 74. In the WL voltage control signal generating circuit 7, when a signal ENVPPSL1 and a signal VPROGCOMP2 become active (high), the latch circuit 74 latches the signal of high (on an output DB) and generates a signal ENVPPSL2 of a high level. The signal ENVPPSL2 is input into the frequency converting circuit 9 to adjust the potential to be applied to the gate of the memory cell 5.

Figure 8:
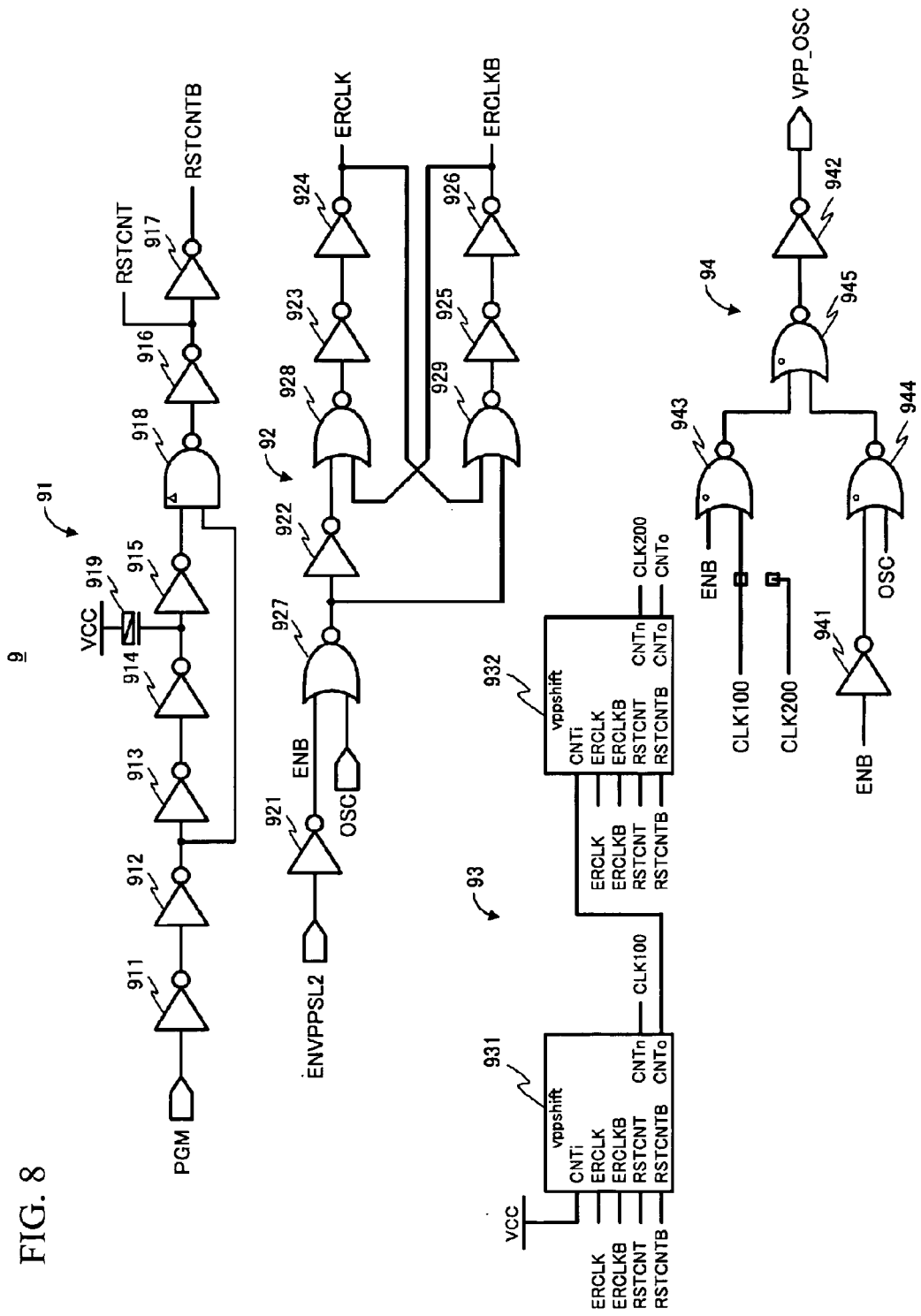
FIG. 8 a view showing a frequency converting circuit in accordance with the first embodiment of the present invention.

FIG. 8 is a view showing the frequency converting circuit 9. As shown in FIG. 8, the frequency converting circuit 9 includes circuits 91 through 94. The circuit 91 includes inverters 911 through 917, a NAND circuit 918, and a capacitor 919. The signal PGM is input into the inverter 911, and outputs from the inverters 912 and 915 are input into the NAND circuit 918. A signal RSTCNT is output from the inverter 916, and an inverted signal thereof RSTCNTB is output from the inverter 917 to the circuit 93. In this manner, when the signal PGM turns from low to high, the signal RSTCNTB outputs a low pulse to reset the circuit 93.

The circuit 92 includes inverters 921 through 926 and NOR circuits 927 through 929. The signal ENVPPSL2 applied from the WL voltage control signal generating circuit 7 is input into the inverter 921. An output from the inverter 921 and the clock signal OSC are input into the NOR circuit 927. The output from the NOR circuit 927 is input into the inverter 922 and the NOR circuit 929. The output from the inverter 924 is input into the NOR circuit 929. The output from the inverter 926 is input onto the NOR circuit 928. The output from the inverter 924 is input into a shifter 931 as a signal ERCLK, and the output from the inverter 926 is input into the shifter 931 as a signal ERCLKB. In this manner, in the circuit 92, when the signal ENVPPSL2 is low, the clock signal OSC is disabled and the signal ERCLK is fixed to low. When the signal ENVPPSL2 is high, the clock signal OSC is enabled and the signal ERCLK is the clock signal OSC. The signal ERCLK activates the circuit 93.

Figure 9:
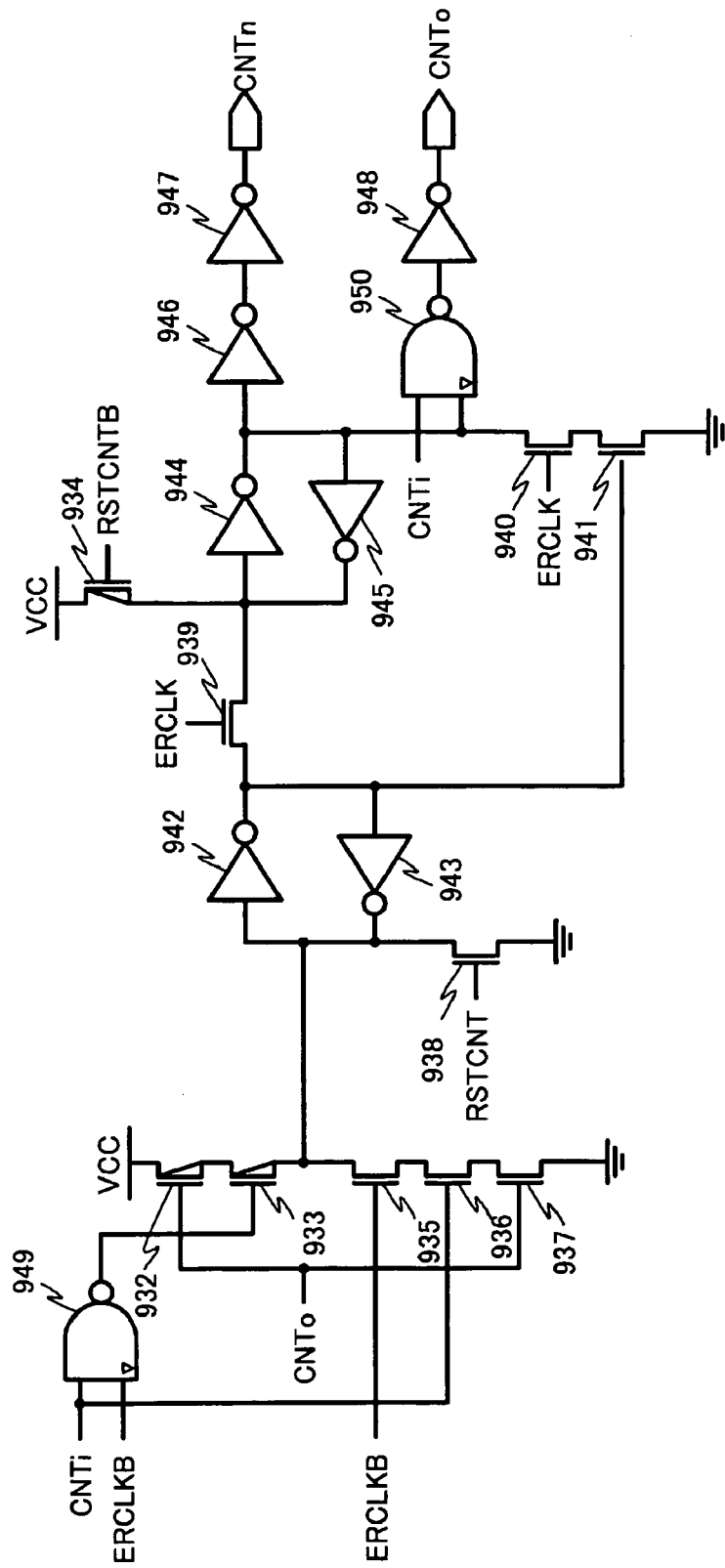
FIG. 9 a view showing a shifter in accordance with the first embodiment of the present invention.

The circuit 93 is a frequency dividing circuit including the shifter 931 and a shifter 932. FIG. 9 is a view showing the shifter 931. As shown in FIG. 9, the shifter 931 includes PMOS transistors 932 through 934, NMOS transistors 935 through 941, inverters 942 through 048, NAND circuits 949 and 950. A clock signal CLK 100 or a clock signal CLK 200 is generated with the signal ERCLK, the signal ERCLKB, the signal RSTCNT, and the signal RSTCNTB, and is applied to the circuit 94. In this manner, the circuit 93 generates the clock signal CLK 100 having a double cycle and the clock signal CLK 200 having a quadruple cycle while the signal ERCLK is operating in accordance with the clock signal OSC. However, the signal ERCLK is fixed, no clock signal is generated.

Referring back to FIG. 8, the circuit 94 includes inverters 9411 and 9412, NOR circuits 9413 through 9415. Either clock signal CLK 100 or the clock signal CLK 200 and an enable signal ENB are input into the NOR circuit 9413. Here, the clock signal CLK 100 or the clock signal CLK 200 is chosen by a metal wiring. An output from the inverter 9411, after receiving the enable signal ENB, and the clock signal OSC are input into the NOR circuit 9414. Outputs from the NOR circuit 9413 and 9414 are input into the NOR circuit 9415. The clock signal VPP_OSC is output to the WL voltage generating circuit 10 from the inverter 9412. In this manner, when the signal ENB is high (the signal ENVPPSL2 is low), the signal VPP_OSC is the clock signal OSC. When the signal ENB is low (the signal ENVPPSL2 is high), the signal VPP_OSC is the clock signal CLK 100 or 200.

It is configured in such a manner that if the clock signal CLK 100 is input, the frequency of the clock signal VPP_OSC becomes two times that of the clock signal OSC, and if the clock signal CLK 200 is input, the frequency of the clock signal VPP_OSC becomes four times that of the clock signal OSC. A description will be given with the clock signal CLK 100.

If a small number of bits are programmed simultaneously, the output VPROG from the program voltage supply circuit 2 is not dropped. Therefore, the signal ENVPPSL2 is low. The frequency converting circuit 9 outputs as the clock signal VPP_OSC without changing the frequency of the clock signal OSC. This maintains the pumping rate of the word line WL high. In contrast, if the number of bits to be programmed simultaneously is increased and the output VPROG from the program voltage supply circuit 2 is dropped, the signal ENVPPSL2 turns to high. The frequency converting circuit 9 converts the clock signal OSC into the clock signal VPP_OSC having a double frequency. The pumping rate of the word line WL becomes moderate, the current for programming the memory cell 5 is decreased, and the program voltage VPROG in the program voltage supply circuit 2 is increased to an original value.

Figure 10:
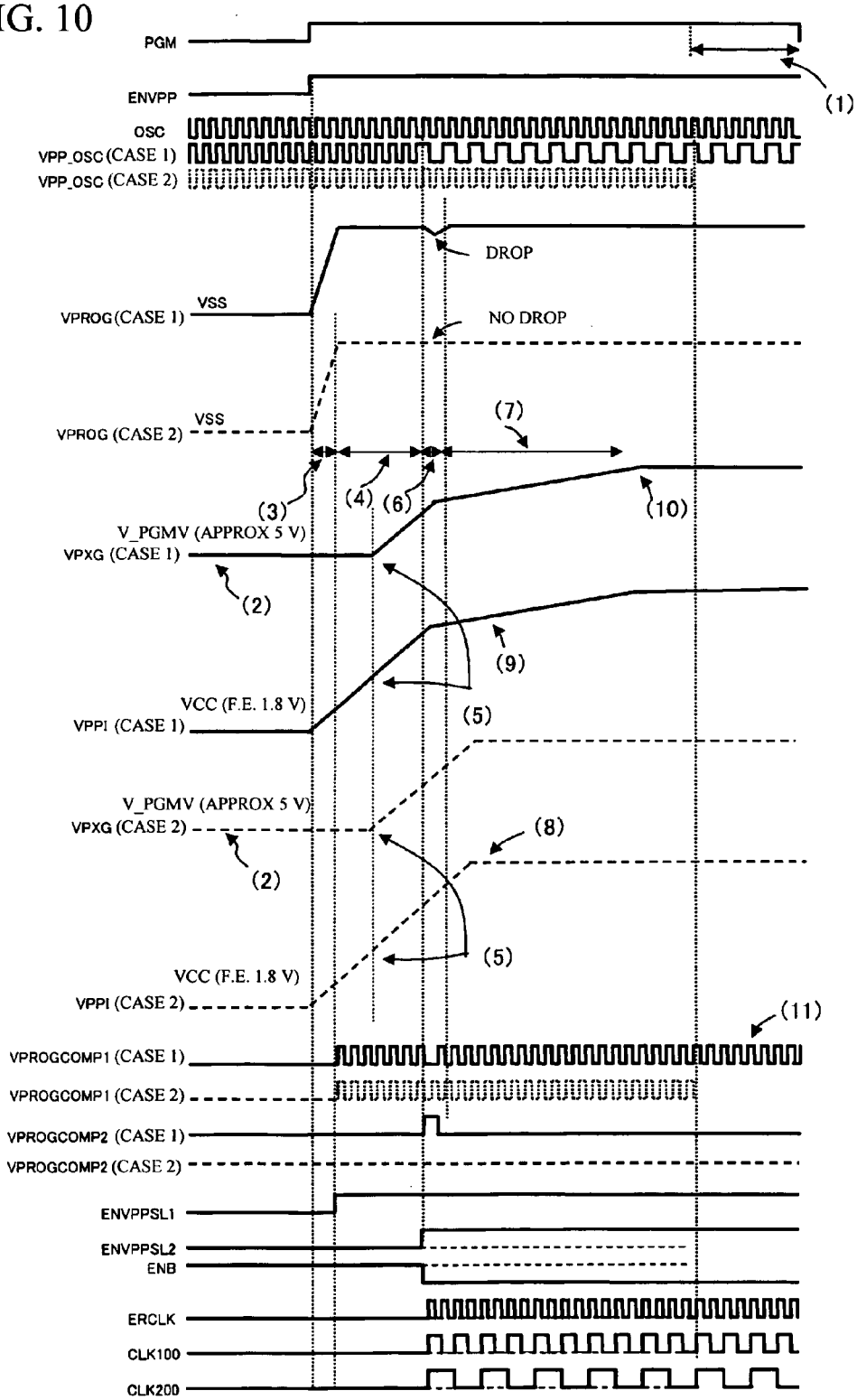
FIG. 10 is a timing chart of the non-volatile semiconductor memory device in accordance with the first embodiment of the present invention.

Next, a description will be given of the operation of the non-volatile semiconductor memory device in accordance with the first embodiment. FIG. 10 is a timing chart of the non-volatile semiconductor memory device 1 in accordance with the first embodiment. The program operation in accordance with the present embodiment has two cases. Case 1: the number of the bits to be programmed is large and the program voltage VPROG is dropped. Case 2: the number of the bits to be programmed is relatively small and the program voltage VPROG is not dropped. Here, the waveforms of the case 1 are shown as solid lines and those of the case 2 are shown as dotted lines.

In a program verify period (2), a voltage V_PGMV is applied to the word line WL. In a period of (3), in the PMOS transistor 22 in the program voltage supply circuit 2, the divided voltage CDV of the program voltage VPROG is smaller than the reference voltage VREF1. Therefore, the PMOS transistor 22 is always in on state and the program voltage VPROG is rapidly pumped to a given voltage (for example, 5 V). In a period of (4), the PMOS transistor 22 in the program voltage supply circuit 2 repeats on or off (see the waveform of the VPROGCOMP1) whenever the divided voltage CDV gets higher or lower than the reference voltage VREF1 so that the program voltage VPROG may be kept constant. The voltage VPPI is pumped to the given voltage, the charge pumped voltage VPPI is supplied to the WL voltage supply circuit 11. A gate voltage VPXG is output onto the word line WL, and then an actual program starts on the memory cell 5 (5).

The PMOS transistor 22 in the program voltage supply circuit 2 is always in on state, if the divided voltage CDV of the program voltage VPROG is smaller than the reference voltage VREF1. However, if the program voltage VPROG is dropped to satisfy that the program voltage VPROG is smaller than the reference voltage VREF 2, the charge pumped voltage VPPI, namely, the pumping rate of the word line WL is lowered (6). In a period of (7), the program voltage VPROG is returned to the given voltage, and the program voltage supply circuit 2 operates as the period (4) for regulation.

In the case 2 shown as (8), the WL voltage generating circuit 10 is driven by the clock signal VPP_OSC having the same cycle as that of the clock signal OSC. Accordingly, the WL voltage generating circuit 10 is pumped rapidly. In contrast, in the case 1 shown as (9), the world line voltage is increased to a certain value and the program voltage VPROG is dropped (the ENVPPSL2 becomes high), and then the WL voltage generating circuit 10 is driven by the clock signal VPP_OSC having a double cycle. The ramping rate of the word line WL is controlled to be low. The gate voltage VPXG is pumped to a maximum (approximately 9 V), and then is regulated to keep constant. In this manner, in the program voltage detection circuit 6, a control circuit of the chip, not shown, sets the signal PGM to active only in a given period, while a signal VPROGCOMP2 keeps low. However, once the signal VPROGCOMP2 becomes high and the program voltage VPROG is detected to have been dropped, the control circuit of the chip controls the signal PGM to have a long active period so as to lengthen the program period. The period shown as (1) denotes a time difference of the program period between the cases 1 and 2.

In accordance with the present embodiment, the output voltage from the program voltage supply circuit 2 that supplies the drain voltage is monitored at the time of programming the memory cell. If the voltage is dropped from a given value, the frequency of the clock signal, which is to be input into the WL voltage generating circuit 10 that controls the gate voltage, is delayed not to let the current flow into the memory cell excessively. That is to say, if a large number of bits is to be programmed and exceeds the current supply capacity of the program voltage generating circuit 1, the pumping rate of the word line WL is lowered. If a small number of the bits is to be programmed, the memory cell is programmed without lowering the pumping rate of the word line. It is therefore possible to program the memory cell making the best use of the current supply capacity of the program voltage generating circuit 1.

Second Embodiment

Figure 12:
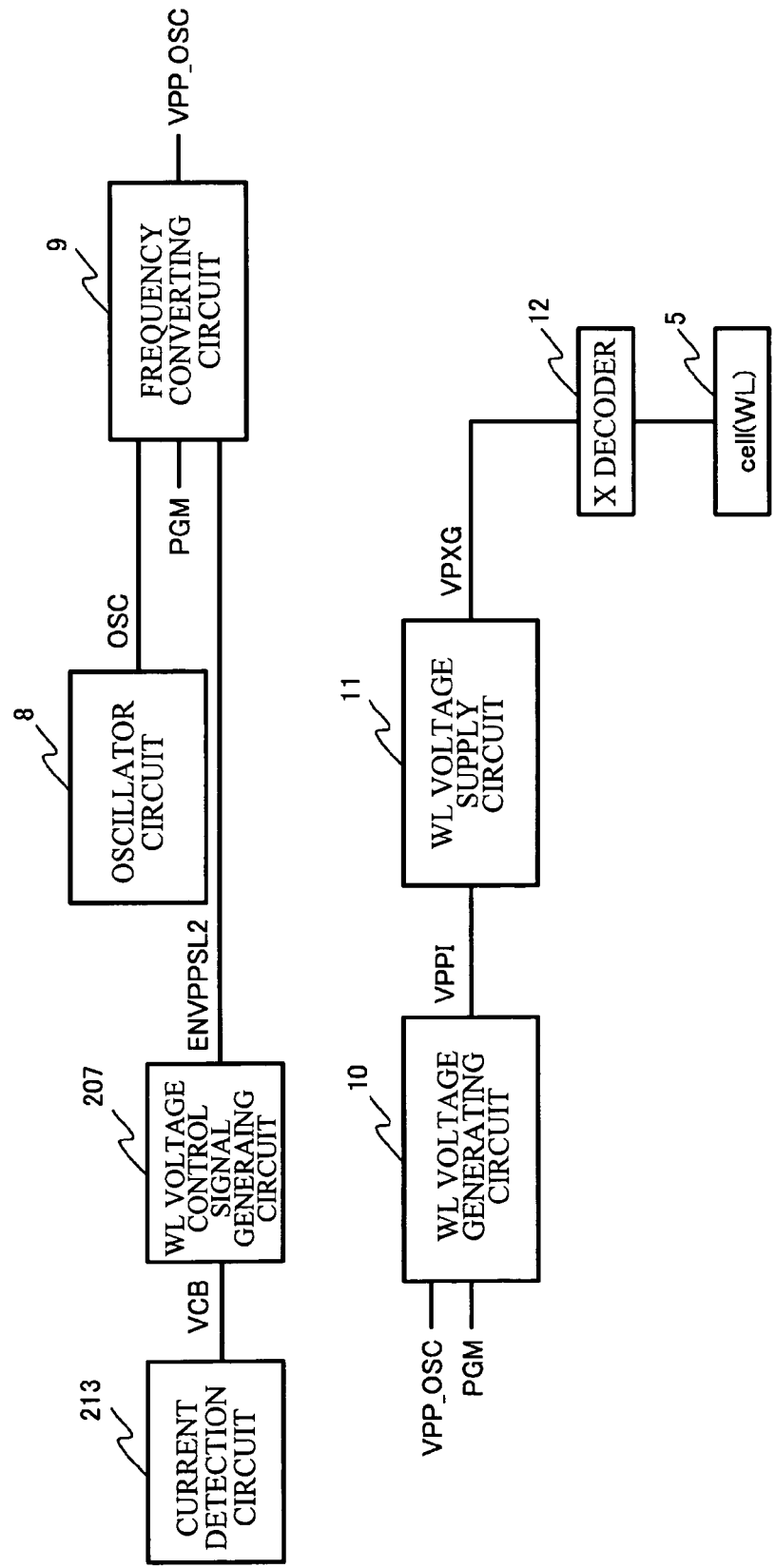
FIG. 12 is another view partially showing the circuit configuration of the non-volatile semiconductor memory device in accordance with the second embodiment of the present invention.

Next, a description will be given of a second embodiment. FIG. 11A is a view partially showing a circuit configuration of the non-volatile semiconductor memory device in accordance with the second embodiment. FIG. 12 is a view partially showing a circuit configuration of the non-volatile semiconductor memory device in accordance with the second embodiment. As shown in FIGS. 11A through 11C and FIG. 12, a non-volatile semiconductor memory device 200 includes the program voltage generating circuit 1, the program voltage supply circuit 2, the data in buffer circuit 3, the Y decoder (ysel) 4, the memory cell 5, a WL voltage control signal generating circuit 207, the oscillator circuit 8, the frequency converting circuit 9, the WL voltage generating circuit 10, the WL voltage supply circuit 11, the X decoder 12, and a current detection circuit 213. The gate of the memory cell 5 is controlled by the voltage applied to the word line WL. Pass transistors 41 and 42 are provided for selecting the bit line BL.

The data in buffer circuit 3 includes NMOS transistors 31 through 33, PMOS transistors 34 through 36, and an inverter 37. The NMOS transistors 32 and 33 and the PMOS transistors 34 and 35 compose a level shift circuit. At the time of programming, a signal PGMn is turned to high, the high program voltage VPROG is directly supplied to a data bus DATABn from the PMOS transistor 36.

The current detection circuit 213 detects the drop of the program voltage VPROG supplied by the program voltage supply circuit 2 with a current output from the program voltage supply circuit 2. The current detection circuit 213 includes a PMOS transistor 214 and a comparator circuit 215. In the PMOS transistor 214, the gate and drain are connected between the output from the program voltage supply circuit 2 and the 16-bit data bus DATABn. The comparator circuit 215 includes NMOS transistors 51 through 53, PMOS transistors 54 and 55, an inverter 56, resistors 57 and 58. The voltages of terminals provided on an upper side and on a lower side of the PMOS transistor 214 are supplied to the comparator circuit 215. The input into the comparator circuit 215 and the PMOS transistor 214 compose a current mirror structure. It is desirable that the input transistor 54 in the comparator circuit 215 should have a smaller size.

In the comparator circuit 215, when the signal PGM is high at the time of programming the memory cell 5 connected to the data bus DATABn, a node N1 connected by the inverter 56 becomes the ground potential. A reference potential is generated in a node VR by dividing the resistance between the power supply voltage Vcc and the ground. A current I_cell is the current corresponding to a total value of respective cells I_celln. The current I_cell is compared with a reference current I_ref, and the current I_cell becomes relatively larger than the current I_ref (which denotes the drop in the first embodiment), a VC in the comparator circuit 215 becomes low. FIG. 11B shows a waveform of an inverted signal VCB of the signal VC. The signal VCB has the same meaning as the VPROGCOMP2 in the first embodiment. The subsequent operation thereof is same as that in the first embodiment.

Figure 13:
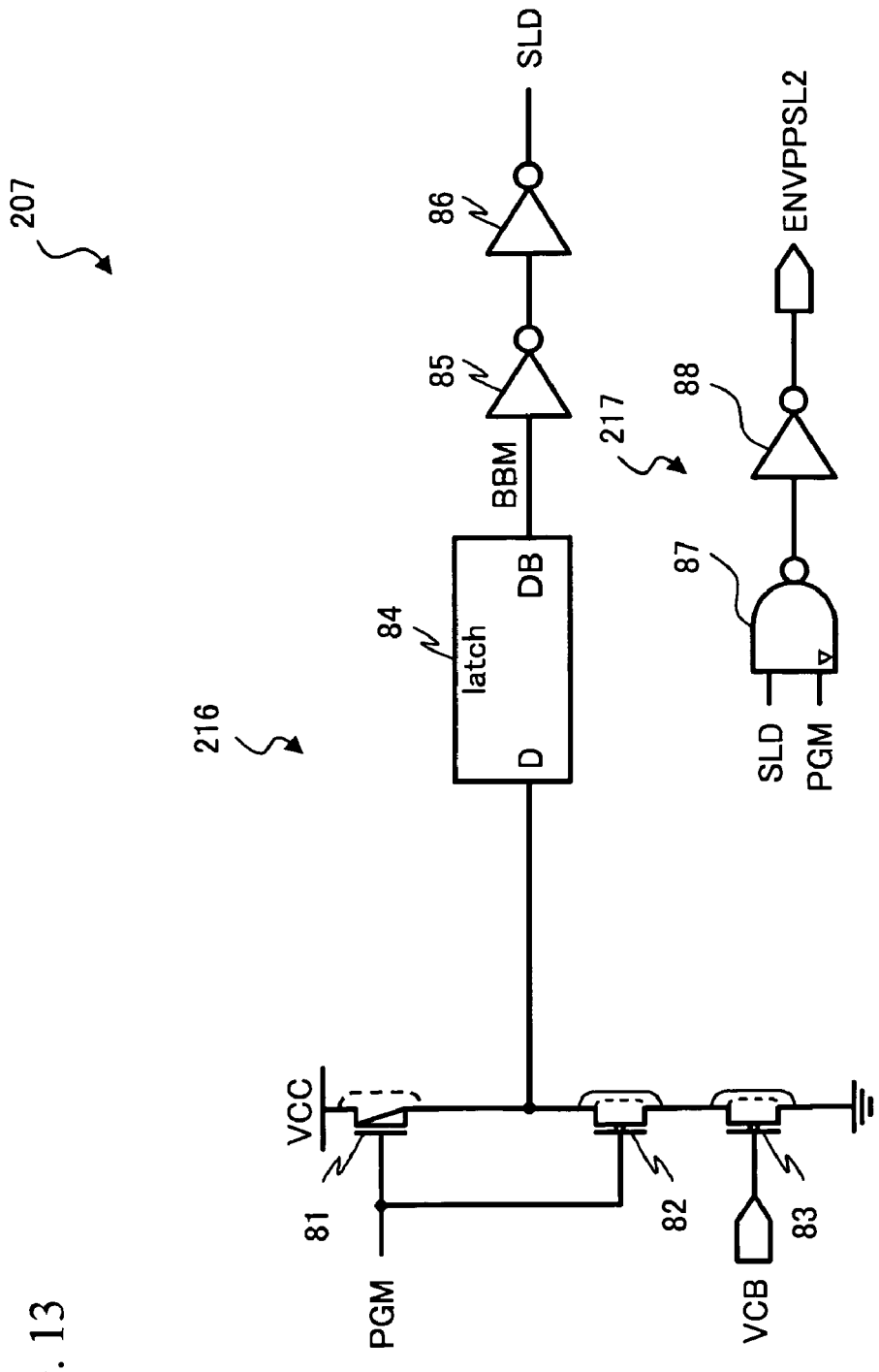
FIG. 13 is a view showing a WL voltage generating circuit in accordance with the second embodiment of the present invention.

FIG. 13 is a view showing the WL voltage control signal generating circuit. As shown in FIG. 13, a WL voltage control signal generating circuit 207 includes circuits 216 and 217. The circuit 216 includes a PMOS transistor 81, NMOS transistors 82 and 83, a latch circuit 84, and inverters 85 and 86. The signal SLD is generated with the signal PGM that tunes to high at the time of programming and the signal VCB output from the current detection circuit 213. The circuit 217 includes a NAND circuit 87 and an inverter 88, and generates the signal ENVPPSL2 with the signal SLD and the signal PGM to supply to the frequency converting circuit 9.

In the WL voltage control signal generating circuit 207, when the signal PGM and the signal VCB are active (both are high), the latch circuit 84 latches the signal of high (on an output DB) to generate the signal ENVPPSL2 of high. The potential applied to the gate of the memory cell 5 is adjusted with the use of the signal ENVPPSL2. The oscillator circuit 8 generates the clock signal OSC. The frequency converting circuit 9 receives the control signal ENVPPSL2 and the signal PGM, and converts the clock signal OSC into the clock signal VPP_OSC.

The WL voltage generating circuit 10 receives the clock signal VPP_OSC output from the frequency converting circuit 9, and generates the charge pumped voltage VPPI, which is a high voltage of the word line WL. The WL voltage generating circuit 10 determines the pumping rate of the word line WL to be pumped according to the clock signal VPP_OSC applied from the frequency converting circuit 9.

The WL voltage supply circuit 11 operates to adjust the charge pumped voltage VPPI, which is generated by the WL voltage generating circuit 10, to a given voltage, and applies the gate voltage VPXG to the X decoder 12.

In accordance with the second embodiment, the output voltage from the program voltage supply circuit 2 that supplies the drain voltage is monitored at the time of programming the memory cell. If the current is flown more than a given value, the frequency of the oscillating signal, which is an internal clock signal to be input into the WL voltage generating circuit 10, is delayed to control the gate voltage so that the current may not flow into the memory cell excessively.

Although a few preferred embodiments of the present invention have been shown and described, it would be appreciated by those skilled in the art that changes may be made in these embodiments without departing from the principles and spirit of the invention, the scope of which is defined in the claims and their equivalents. In the above-mentioned embodiments, the multi-level memory cell of 2 bits has been described as an example; however, the present invention is not limited to this. The above-mentioned non-volatile semiconductor memory device may be incorporated into the semiconductor device. Moreover, on the non-volatile semiconductor memory device embodying the present invention, the frequency of the clock signal applied from the oscillator circuit is converted in the frequency converting circuit to obtain the clock signals having different frequencies. However, multiple oscillator circuits may be provided to generate the clock signals having different frequencies, and then the clock signal is selected according to the program voltage in the WL voltage generating circuit to produce the voltage to be supplied to the gate of the memory cell.

What is claimed is:

1. A semiconductor device comprising:
    a program voltage supply circuit that supplies a drain of a memory cell with a program voltage; and
    a voltage generating circuit that generates a voltage supplied to a gate of the memory cell by using a clock signal based on the program voltage supplied by the program voltage supply circuit.

2. The semiconductor device as claimed in claim 1, wherein the voltage generating circuit uses, a clock signal having a lower and a higher frequency, and wherein the lower frequency is used when the program voltage supplied by the program voltage supply circuit becomes equal to or lower than a given voltage.

3. The semiconductor device as claimed in claim 1, further comprising a frequency converting circuit that generates the clock signal by converting a frequency of a clock signal generated by an oscillator circuit into another frequency based on the program voltage supplied by the program voltage supply circuit.

4. The semiconductor device as claimed in claim 1, further comprising a frequency converting circuit that generates the clock signal by converting a frequency of a clock signal generated by an oscillator circuit into a lower frequency when the program voltage supplied by the program voltage supply circuit becomes equal to or lower than a given voltage.

5. The semiconductor device as claimed in claim 1, further comprising a detection circuit that refers to an output voltage of the program voltage supply circuit and detects a decrease of the program voltage supplied thereby.

6. The semiconductor device as claimed in claim 1, further comprising a detection circuit that refers to an output current of the program voltage supply circuit and detects a decrease of the program voltage supplied thereby.

7. The semiconductor device as claimed in claim 3, further comprising a circuit that generates a control signal for controlling the frequency of the clock signal converted by the frequency converting circuit in accordance with the program voltage supplied by the program voltage supply circuit.

8. The semiconductor device as claimed in claim 1, wherein the voltage generating circuit generates the voltage supplied to the gate of the memory cell by a ramping manner.

9. The semiconductor device as claimed in claim 1, wherein the voltage generating circuit comprises a diode type charge pump.

10. The semiconductor device as claimed in claim 1, wherein the semiconductor device is a semiconductor memory device.

11. A method of controlling a semiconductor device comprising the steps of:
    supplying a program voltage to a drain of a memory cell; and
    generating a voltage supplied to a gate of the memory cell by using a clock signal determined based on the program voltage.

12. The method as claimed in claim 11, further comprising a step of converting a frequency of a clock signal generated by an oscillator circuit into a lower frequency when the program voltage becomes equal to or lower than a given voltage, wherein the step of generating generates the voltage supplied to the gate of the memory cell by using the clock signal of the lower frequency.

13. The method as claimed in claim 11, further comprising a step of detecting the program voltage by referring to an output voltage of a program voltage supply circuit that generates the program voltage.

14. The method as claimed in claim 11, further comprising a step of detecting the program voltage by referring to an output current of a program voltage supply circuit that generates the program voltage.

* * * * *